US007227347B2

(12) United States Patent
Viaro et al.

(10) Patent No.: US 7,227,347 B2
(45) Date of Patent: Jun. 5, 2007

(54) DEVICE AND METHOD FOR MEASURING A CURRENT

(75) Inventors: Francesco Viaro, Albino (IT); Francesco Casalinuovo, Cavarnago (IT)

(73) Assignee: ABB Services S.r.l. (IT)

( * ) Notice: Subject to any disclaimer, the term of this patent is extended or adjusted under 35 U.S.C. 154(b) by 178 days.

(21) Appl. No.: 10/658,260

(22) Filed: Sep. 10, 2003

(65) Prior Publication Data

US 2004/0128087 A1 Jul. 1, 2004

(30) Foreign Application Priority Data

Sep. 12, 2002 (IT) .......................... BG2002A0027

(51) Int. Cl.
*G01R 15/20* (2006.01)
(52) U.S. Cl. ................................. 324/117 H
(58) Field of Classification Search ................ 324/765, 324/754, 158.1, 117 R, 117 H, 127, 142
See application file for complete search history.

(56) References Cited

U.S. PATENT DOCUMENTS

| | | | |
|---|---|---|---|
| 2,585,707 A | | 2/1952 | Warner |
| 4,037,150 A | | 7/1977 | Taranov et al. |
| 4,706,073 A | * | 11/1987 | Vila Masot ................. 340/639 |
| 4,851,763 A | * | 7/1989 | Grutzmacher et al. ...... 324/127 |
| 5,548,279 A | * | 8/1996 | Gaines ....................... 340/664 |
| 5,621,319 A | | 4/1997 | Bilotti et al. |
| 6,252,389 B1 | | 6/2001 | Baba et al. |
| 6,472,878 B1 | * | 10/2002 | Bruchmann ................. 324/424 |
| 6,570,373 B1 | * | 5/2003 | Viola ......................... 324/130 |
| 6,717,396 B2 | * | 4/2004 | Viola ...................... 324/117 R |
| 6,734,660 B1 | * | 5/2004 | Berkcan et al. ......... 324/117 R |
| 6,750,644 B1 | * | 6/2004 | Berkcan .................. 324/117 R |
| 6,777,932 B2 | * | 8/2004 | Hara et al. .................. 324/251 |
| 6,836,137 B2 | * | 12/2004 | Hartmann ................... 324/765 |
| 2002/0041180 A1 | | 4/2002 | Lancaster et al. |

FOREIGN PATENT DOCUMENTS

DE 197 41 417 A1 4/1999
GB 1478810 7/1977

* cited by examiner

*Primary Examiner*—Jermele Hollington
(74) *Attorney, Agent, or Firm*—Connolly Bove Lodge & Hutz LLP

(57) ABSTRACT

A device and method for current measurement in a conductor and, in particular, a method to feed the devices of the invention in order to interpret the information provided. The method is based on the exploitation of discrete sampling of the information provided from the devices of the invention and allows the feeding of these devices to be modulated in order to activate the devices only when necessary.

13 Claims, 3 Drawing Sheets

DEVICE AND METHOD FOR MEASURING A CURRENT

FIELD OF THE INVENTION

The present invention relates to a device for the current measurement, particularly for low voltage circuit breakers (i.e., for voltage values lower than 1 kV), and a method for the current measurement.

BACKGROUND OF THE INVENTION

The presently known methods to detect and make available the current parameters concerning a conductor are normally based on the use of transducers, for example current transformers. In case of automatic low voltage circuit breakers, it is normally necessary to use at least one transducer for each phase plus one optional for the neutral. Such transducers, in particular the current transformers, are normally positioned around the conductors, whose currents have to be measured, and which constitute the primary winding of the transformer, and are operatively connected, through the corresponding secondary circuits, to the reading unit. In the case of the automatic circuit breakers, such secondary circuits are operatively connected to the protection unit of the circuit breaker itself.

The use of current transformers has the considerable advantage of the self-feeding principle. The energy that can be taken from the magnetic fields produced by the conductors exposed to measurement is in fact normally sufficient to generate useful signals for the reading and, when needed, subsequent treatments.

If from one side the current transformers can function without the necessity of an auxiliary feeding, on the other side they are in some ways limited.

A first limit is the possibility of functioning only with alternate current, and therefore they cannot be used in circuits with direct currents or with very low frequence currents.

A further limit of current transformers derives from the necessity of surrounding the conductors exposed to measurement with electromagnetic transducer means. Other problems are given by their dimensions and weight, and by the high cost of the windings, usually in copper.

A further limit of this category of transducers consists in the so called saturation phenomenon: such phenomenon is part of the nature of ferromagnetic materials, which form the windings' cores, and bring about a strong decay of the reading linearity in correspondence with high values of the currents in the conductor exposed to measurement.

In the specific case of low voltage circuit breakers, all the installation, substitution and removal procedures of current transformers are extremely complicated, and it is often necessary to remove many pieces of the device that contains them.

Different alternative solutions have been tested in order to overcome such disadvantages, but they have been scarcely used in the practice, because of other limits connected to their use.

Among the different existing alternative solutions, the Rogowski coils are to be mentioned, even though they can function only in the presence of alternate current. The Rogowsky coils, economical enough in applications characterised by strong currents, turns to be uneconomical with low currents, because their good functioning is bound to an extreme accuracy of construction and installation.

Another alternative solution already known in order to detect the values of current in electric conductors consists in the use of magnetic field sensors, for example the Hall sensors, which are very accurate, light and economical. The magnetic field sensors, which perfectly function with alternate current and with direct current, need to be fed and has a limit in the not marginal energy absorption.

In practice, in the applications characterised by low current it is impossible at the current level of the art to feed the magnetic field sensors by using the energy derived form the magnetic field present near the conductor exposed to measurement. In these cases, it is necessary an external or auxiliary feeding source. Such necessity, never overcome till now, turns into a heavy practical limit in the application of such solution.

It is evident from what described above, that at current level of the art there is the need to have systems for sensing currents in electric conductors, which represent a valid alternative to the above mentioned solutions. This necessity is much more evident in case of applications where the autonomy and the reliability of functioning are requested also with low currents, as for example in association with automatic low voltage circuit breaker.

SUMMARY OF THE INVENTION

The aim of the present invention is to provide a device and a method for the measurement of the currents flowing in electric conductors, which allows to use the accuracy of magnetic field sensors, overcoming at the same time the above mentioned limits.

Within this aim, one of the object of the present invention is to provide a device and a method for the measurement of the currents flowing in electric conductors, having extreme sensibility, accuracy and reliability, and which is characterised by a wide range of linear functioning.

Another important object is to provide a device and a method for the measurement of the currents flowing in electric conductors, which is extremely resistent, light, easy to handle and less bulky, and which can be produced in an industrially convenient way.

Still another object is to provide a device and a method for the measurement of the currents flowing in electric conductors, which does not have the need to completely wind the conductors with interface devices.

Another object of this invention is to provide a device and a method for the measurement of the currents flowing in electric conductors, which is of high reliability, relatively easy to produce and with competitive costs.

Such aim and objects, as well as other which will better emerge afterwards, are realised by a device for the measurement of the current in a conductor, comprising:
  means for detecting a current,
  means for the transmission of a signal indicative of the current,
  electronic means for the control, acquisition and processing of such signal indicative of the current,
  connecting means for the feeding of the device and for the communication.

The device according to the invention in characterised in that it includes means for the partialised feeding of such means for detecting a current. In this way, the device according to the invention has a completely innovative configuration, in particular with reference to the way in which the measurement is carried out.

BRIEF DESCRIPTION OF THE DRAWINGS

Further characteristics and advantages of the invention will better emerge from the description of favourite, but not limiting, embodiments of the device and of the method for the measurement of the currents flowing in electric conductors according to the invention, illustrated only by way of non-limitative example in the accompanying drawings, wherein.

DESCRIPTION OF THE PREFERRED EMBODIMENTS

The device according to the invention will be described with reference to the above mentioned figures, without limiting its application.

Figure 1:
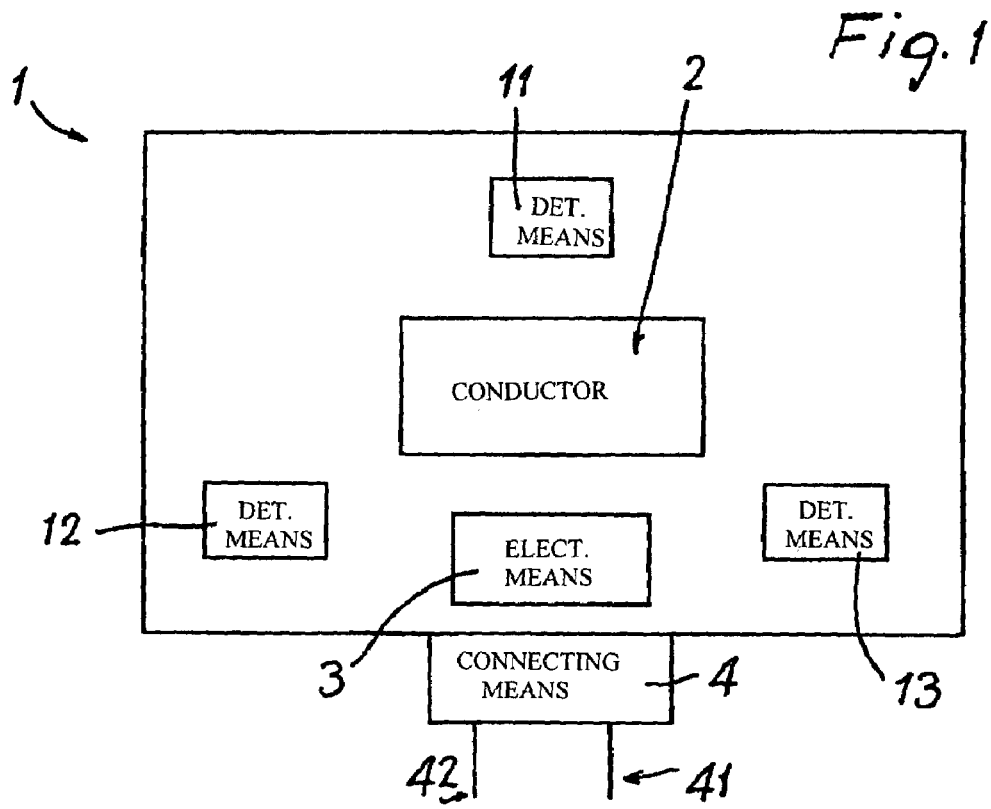
FIG. 1 is a block scheme which schematically represents some functions of the device according to the invention.
Figure 2:
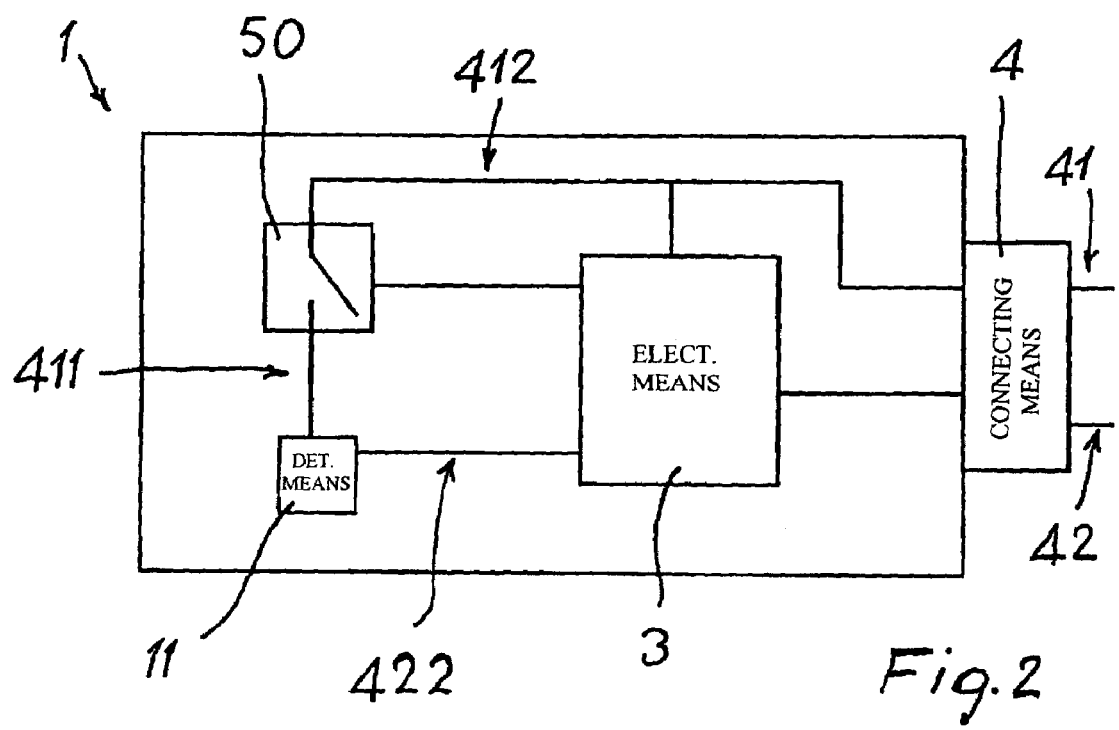
FIG. 2 is a block scheme which represents the functioning principle of the device according to the invention.
Figure 3:
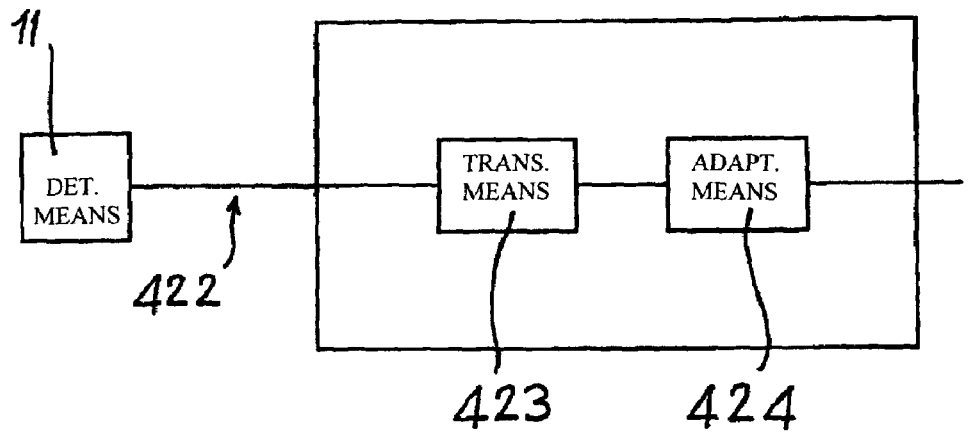
FIG. 3 is a block scheme which represents some details of the communication and signal treatment means of the device according to the invention.

With reference to FIGS. 1, 2 and 3, the reference number 1 indicates the device for the measurement (MEAS. DEVICE) of a current, according to the invention, in a conductor 2. Such device includes one or more means for detecting (DET. MEANS) the current 11, 12 and 13, properly positioned with respect to the conductor 2. Means 422 are then present for the transmission of a signal indicative of the current, which are generally interposed between such current detection means 11, 12, 13 and the electronic means (ELECT. MEANS) for the control, acquisition and processing of such signal indicative of the current.

Furthermore, the device 1 includes connecting means 4 for the feeding of the device and for the communication.

The main characteristic of the device according to the invention is given by the presence of the means 50 for the partialised feeding of such means for detecting a current. Advantageously, the means 50 for the partialised feeding are controlled by such control, acquisition and processing electronic means 3.

In practice, the partialised feeding means 50 act on the feeding line schematically represented with the reference number 412 according to an on/off sequence, controlled by the electronic means 3. The detection means 11 are consequentially fed by a feeding line schematically represented with the reference number 411.

Preferably, the means for the current detection 11 include at least one isolating support carrying a magnetic field sensor, for example a Hall sensor.

Advantageously, the means 422 for the transmission (TRANS. MEANS) of a signal indicative of the current include an analogue acquisition chain, able to get analogue signals generated by the magnetic field sensor. The means 422 are then linked to the means 423 of adaptation (ADAPT. MEANS) of such signal, such means 423 being able to make such signals representative of the nature and value of the currents flowing in the conductors and then available for the reading or for subsequent interpretation and uses, for example in connection with an over-current relay in case of use in automatic switches.

According to a preferred embodiment, the means 423 of adaptation of such analogue signal are connected to means 424 of analogue-to-digital conversion. In this way, the signal is substantially immune from decay and interferences during its transmission from the above mentioned acquisition chain to the final reading steps or further interpretation or use.

Preferably, the device according to the invention includes connecting means 4 for the interface, which include feeding means 41 and means 42 of bidirectional communication.

The device according to the invention can be self-fed, for example through connection of the feeding means 41 to a current transformer positioned on the conductor exposed to measurement.

Alternatively, the feeding means 41 are linked with an external feeding source.

Figure 5:
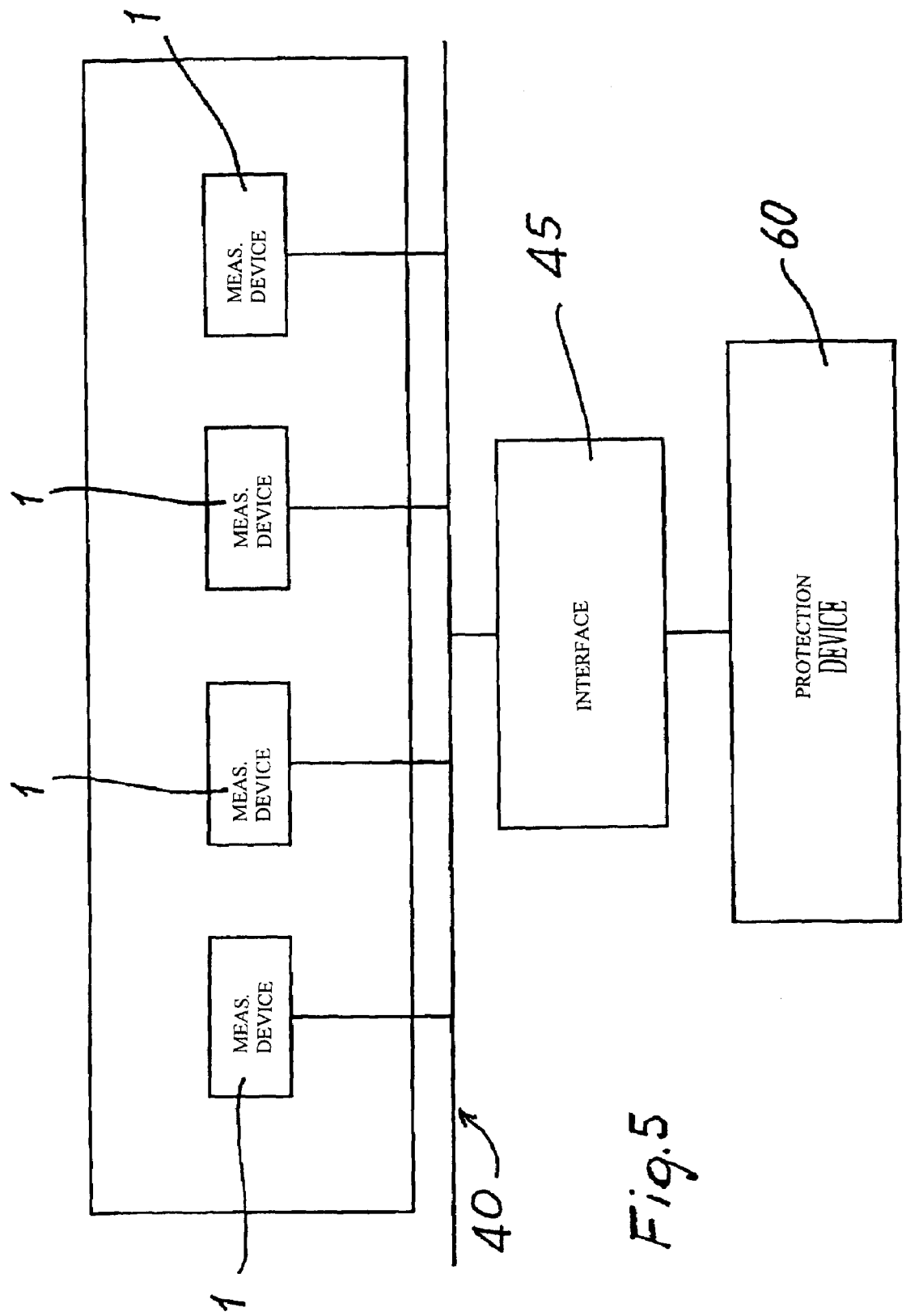
FIG. 5 is a block scheme which represents some details of an automatic low voltage circuit breaker, including one or more devices according to the invention.

As already mentioned above, and without limiting in any way the application, the device according to the invention find convenient application in automatic low voltage circuit breakers. Referring to FIG. 5, such circuit breakers normally include one or more devices according to the invention, and preferably one for each pole. The devices are connected with a communication bus 40, connected in its turn with a protection device 60 through an interface 45.

A further aspect of this invention refers to a method for the current measurement in a conductor and in particular to a method to feed the devices of the invention and to interpret the information made available by them. Such method is based on the exploitation of samplings carried out in a discrete way, with regular gaps, instead on continuous readings, so that the feeding of the device can be modulated, in order to activate it only when necessary.

In detail, the method according to the invention includes the following cyclic phases:

feeding the device and bringing it in running conditions;
maintaining the feeding for a period of time $\tau$,
bringing the device in a stand-by condition with feeding interruption.

Figure 4:
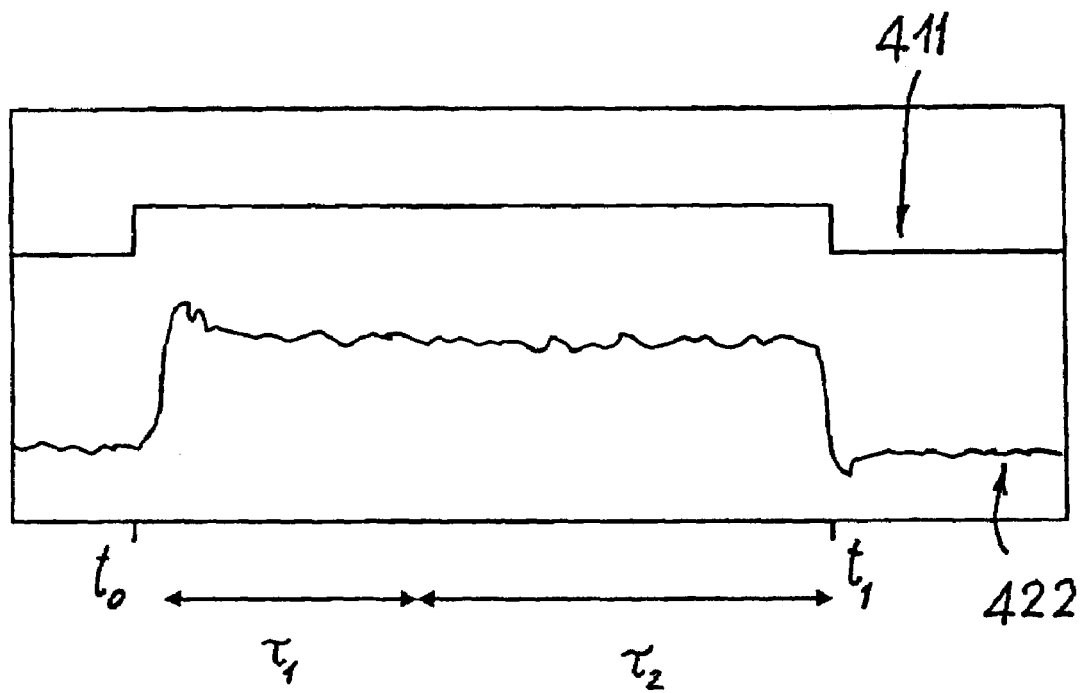
FIG. 4 is a graphic representation of the functioning principle of the device according to the invention and of the corresponding method.

Referring to FIG. 4, the line 411 represents the feeding to the sensor 11, while the line 422 represents the signal in output from the sensor 11. At the time $t_0$, the sensor 11 is fed by the partialised feeding means 50 and begins then to measure the current flowing in the conductor 2, sending then an approximate signal 422 of such current. At the time $t_1$ the partialised feeding means 50 interrupt the feeding to the sensor 11 which goes back to its stand-by position, interrupting the transmission of the signal 422. As shown in FIG. 4, the line 411 represents a typical example of cyclic feeding with square wave, the starting and stopping of the sensor occur respectively in correspondence with the times $t_0$ and $t_1$.

The period of time $\tau$ between $t_0$ and $t_1$ is advantageously divided in a first time fraction $\tau_1$ of stabilisation of the sensor and in a second time fraction $\tau_2$ of reading, treatment and possibly conversion, and transmission of the signal.

It is actually been found that carrying out the reading of the signals deriving from the magnetic field sensors in a discrete way (or intermittently), with a proper frequency according to the application needs, it is possible to fully satisfy different technical requirements.

In order to get a quantity of readings sufficient for the technical aims, it is emerged for example that in case of applications with automatic low voltage circuit breakers, it is possible to carry out feeding cycles with square wave modulated approximately with a frequency of 1 kHz and with on/off time ratio (duty cycle) of about 1/10. This allows to drastically limit the energetic consumption up to values approximately equal to 15% of the consumption normally required with direct feeding.

Naturally, the frequency of the feeding cycles as well as the time ratio on/off can be conveniently chosen according to the accuracy of the measure which has to be realised and to the energetic saving which has to be reached.

It has been practically observed that the device and the method according to the invention completely fulfill the aim, as well as the prefixed objects. It has actually emerged that the use of the partialised feeding means and the feeding method with discrete cycle, which preferably occurs according to cycles with square wave, enormously improve the application of the magnetic field sensors in the most different applications, thanks to the increased autonomy in comparison with external feeding sources.

We claim:

1. A device for measurement of current in a conductor, comprising:
    means for detecting a current;
    means for transmission of a signal indicative of the current;
    electronic means for control, acquisition and processing of the signal indicative of current; and
    connecting means for feeding the device and for communication,
    wherein the device includes means for feeding the means for detecting a current in an intermittent manner,
    wherein a frequency of feeding is predefined and depends on an accuracy of the measurement of current to be performed and energy savings to be achieved, and
    wherein the means for detecting a current are kept on hold when the means for detecting a current are not fed.

2. The device according to claim 1, wherein the means for detecting a current includes an insulating support and at least one magnetic field sensor.

3. The device according to claim 2, wherein the magnetic field sensor is a Hall sensor.

4. The device according to claim 1, wherein the means for feeding are controlled by the electronic means for the control, acquisition and processing of said signal indicative of the current.

5. The device according to claim 1, wherein the means for the transmission of a signal indicative of the current are linked to means of adaptation of the signal.

6. The device according to claim 5, wherein the means of adaptation of the signal are connected to means of analog-to-digital conversion.

7. The device according to claim 1, wherein the connecting means include feeding means and means of bidirectional communication.

8. The device according to claim 7, wherein the feeding means are fed by a current transformer positioned on a conductor.

9. The device according to claim 8, wherein the conductor is a conductor exposed to measurement.

10. The device according to claim 7, wherein the feeding means are linked to an external feeding source.

11. An automatic low voltage circuit breaker including one or more devices according to claim 1, the one or more devices being connected to a communication bus, in its turn connected to a protection device through an interface.

12. A method for the for the measurement of the current in an electric conductor through a device according to claim 1, comprising:
    feeding the device and bringing the device to running condition;
    maintaining the feeding for a period of time r;
    bringing the device in a stand-by condition with feeding interruption.

13. The method according to claim 12, wherein the period of time T is divided in a first time fraction $\tau_1$ of stabilization of the sensor and in a second time fraction $\tau_2$ of reading and transmission of the signal.

* * * * *